US008054088B2

(12) United States Patent
Delforce et al.

(10) Patent No.: US 8,054,088 B2
(45) Date of Patent: Nov. 8, 2011

(54) PASSIVE INTERMODULATION TEST APPARATUS (75) Inventors: Greg Delforce, Murarrie (AU); Mostafa Mohamed Taher AbuShaaban, Runcorn (AU); Frank Strachan, Murarrie (AU)

(73) Assignee: Triasx Pty. Ltd., Murarrie, Queensland (AU)

( * ) Notice: Subject to any disclaimer, the term of this patent is extended or adjusted under 35 U.S.C. 154(b) by 568 days.

(21) Appl. No.: 11/941,712

(22) Filed: Nov. 16, 2007

(65) Prior Publication Data

US 2009/0096466 A1  Apr. 16, 2009

(30) Foreign Application Priority Data

Oct. 10, 2007 (AU) ................................ 2007221921

(51) Int. Cl.
*G01R 23/20* (2006.01)
*G01R 27/28* (2006.01)
(52) U.S. Cl. ........................................ 324/624; 324/612
(58) Field of Classification Search .................. 324/624, 324/612
See application file for complete search history.

(56) References Cited

U.S. PATENT DOCUMENTS

| 4,918,684 | A | 4/1990 | Boschet et al. |
| 5,576,669 | A | 11/1996 | Ruelke |
| 6,646,449 | B2 * | 11/2003 | Seppinen et al. ............. 324/624 |
| 7,003,409 | B2 | 2/2006 | Hepner et al. |
| 2001/0000822 | A1 | 5/2001 | Dell et al. |
| 2002/0094785 | A1 * | 7/2002 | Deats ........................... 455/67.3 |
| 2002/0141509 | A1 | 10/2002 | Hoffmann |
| 2004/0268168 | A1 | 12/2004 | Stanley et al. |
| 2005/0087603 | A1 | 4/2005 | Koenck et al. |
| 2005/0138214 | A1 | 6/2005 | Tjong et al. |
| 2006/0238517 | A1 | 10/2006 | King et al. |

OTHER PUBLICATIONS

Brain, M., "How Electronic Gates Work," Howstuffworks, available at: http://web.archive.org/web/20051216213358/http://electronics.howstuffworks.com/digital-electronics1.html, 2005 (3 pages total).
Ford, S., "The SWR Obsession," QST, Apr. 1994, pp. 70-72 and 74, American Radio Relay League, Inc. (5 pages total).
"Summitek Instruments, Passive Intermodulation Analyzers, Technical Data," pp. 1-10, Oct. 2006, Summitek Instruments, Inc. (10 pages total).
Office Action mailed Oct. 28, 2009, from the U.S. Patent and Trademark Office for U.S. Appl. No. 11/936,968 (20 pages total).
Office Action mailed Jun. 8, 2010, from the U.S. Patent and Trademark Office for U.S. Appl. No. 11/936,968 (21 pages total).

* cited by examiner

*Primary Examiner* — Amy He
(74) *Attorney, Agent, or Firm* — Finnegan, Henderson, Farabow, Garrett & Dunner, LLP (57) ABSTRACT A portable test apparatus for conducting a plurality of tests on a communications device is provided. The unit can include a control panel, which can include at least one display for displaying test information from the device under test. The apparatus can also include a frequency mixing assembly, an amplifier module, a voltage regulator module, and a frequency module. The apparatus can allow a user to measure a number of parameters including, but not limited to, power, return loss and passive intermodulation products.

21 Claims, 11 Drawing Sheets

PASSIVE INTERMODULATION TEST APPARATUS

BACKGROUND

The present disclosure relates generally to radio frequency communication systems. In particular although not exclusively the present disclosure relates to an apparatus for measuring sources of interference.

Quality of Service (QOS) is of major importance to today's communication network providers. One of the major factors effecting QOS in most modern communication is interference. The two most appreciable forms of interference present in most communication systems result from Active and Passive intermodulation. In each case multiple transmitting frequencies combine in ways that cause interference to receiving equipment.

In the case of Active Intermodulation (AIM) interference the transmitter or receiver actively amplify interfering signals in the environment that cause harmful interference. Passive Intermodulation (PIM) interference is similar to active intermodulation interference except that it almost occurs exclusively in passive elements when two or more frequencies are simultaneously present. When signals $F_1$ and $F_2$ for example encounter a non-linear device they combine as follows, $mF1 \pm nF2$, $(m,n=1,2,3 \ldots)$ to produce interfering signals.

To date most suppliers of RF communications components have not been able to model PIM. One can only design components to reduce the possibility of significant levels of PIM being internally generated. Typically this reduction is achieved by applying lessons learnt from past experiences, and from testing the component presently under design. While it is possible to take account for PIM produced by each individual component during the system design phase, the effects of PIM which can be generated outside the components via poor interconnects etc, and when the component are installed on-site cannot be so easily accounted for.

Presently it has been relatively difficult to test for PIM on-site. Historically the equipment required to perform the testing was rather large and cumbersome and not readily suited for in-field deployment and has been widely considered by most in the communications industry as being impractical. Typically such on-site PIM testing requires each junction, line and interconnect to be checked. Without a PIM tester on-site, this operation is extremely labour intensive, requiring a technician to physically check/remake each connection as installed, and as such is extremely costly.

SUMMARY

It would be advantageous to provide a device which allows for the on-site analysis of PIM interference along with other communication system parameters in a single unit and that it performs such testing in an efficient and cost effective manner.

Accordingly in embodiment of the present disclosure, there is provided a portable test apparatus for a communications device, said apparatus comprising at least one display for displaying resultant values of one or more operating parameters of said communications device and a plurality of electronic modules, at least one of which is adapted to measure one or more operating parameters of said communications device, wherein said electronic modules are arranged in a substantially vertical relation.

In another embodiment of the present disclosure, there is provided a portable test apparatus for a communications device, said apparatus, comprising a control panel and at least one display for displaying test information from the device under test; at least one filter module assembly; at least one amplifier module; at least one voltage regulator module; and at least one frequency module; wherein said at least one amplifier module; voltage regulator module and one frequency module are stacked in vertical relation.

Suitably where the modules are stacked in vertical relation, they are stacked linearly on top of one another.

In yet another embodiment there is provided a portable test apparatus for a communications device said apparatus comprising a control panel comprising at least one display for displaying test information from the communications device; at least one filter module assembly; at least one amplifier module; at least one voltage regulator module; at least one frequency module; wherein said at least one amplifier, voltage regulator and frequency module are in a stacked configuration relative to one another.

In a further embodiment there is provided a portable test apparatus for a communications device said apparatus comprising a control panel comprising at least one display for displaying test information from the communications device; at least one filter module assembly; at least one amplifier module; at least one voltage regulator module; at least one frequency module; and a base plate; wherein said at least one amplifier, voltage regulator and frequency module are in a vertically stacked array between said control panel and said base plate.

The test apparatus may include at least one port for the connection of a device under test. The test apparatus may include at least one port as access to a built in low PIM load. Preferably the load is a cable load housed within the test apparatus.

Suitably the apparatus provides a plurality of selectable test modes including but not limited to a power test mode, a return loss test mode and a passive intermodulation test mode. At least one audible tone may be provided in the return loss and passive intermodulation test modes. Preferably the test apparatus includes at least two preset frequency tones, selected from the radio communication frequency bands the preset frequencies being consistent with operating frequency band license allocations. For example the present tones could be selected from a frequency range of about 800 MHz to 1000 MHz or from about 1700 MHz to 2200 MHz. It will of course be appreciated by those skilled in the art that the present tones could be set to any desired frequency by tuning the appropriate frequency generators.

The display may include a LED level or an LCD level display associated with a plurality of calibrated scales wherein each of the plurality of scales is associated with a test mode.

The apparatus may include at least one port for the attachment of an auxiliary device.

The auxiliary device may be a spectrum analyser, a portable computer or the like. Suitably the apparatus may include at least one port for the attachment of an auxiliary device and an I/O port for the attachment of a portable computer or the like.

The filter module may include a triplexer, at least one forward coupler and at least one reverse coupler. The amplifier module preferably includes at least one high power amplifier circuit. Suitably the amplifier module may include first high power amplifier circuit and second high power amplifier circuit in a parallel arrangement. Preferably the voltage regulator provides a plurality of DC voltage rails including at least one +5V rail, at least one +12V rail and at least one +26V rail.

The frequency module may include at least one frequency synthesiser, at least one log detector and at least one down converter circuit; at least one low noise amplifier and at least one voltage Standing Wave Ratio (VSWRi) monitor. Preferably the frequency module may include a first frequency synthesiser, a second frequency synthesiser, and a third frequency synthesiser. Suitably the first and second frequency synthesisers are adapted to produce a frequency between 800 MHz and 1000 MHz and the third frequency synthesiser is adapted to produce a frequency of approximately 50 MHz.

Throughout the specification the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

BRIEF DETAILS OF THE DRAWINGS

In order that this disclosure may be more readily understood and put into practical effect, reference will now be made to the accompanying drawings, which illustrate preferred embodiments, and wherein.

DESCRIPTION OF EMBODIMENTS

Figure 1:
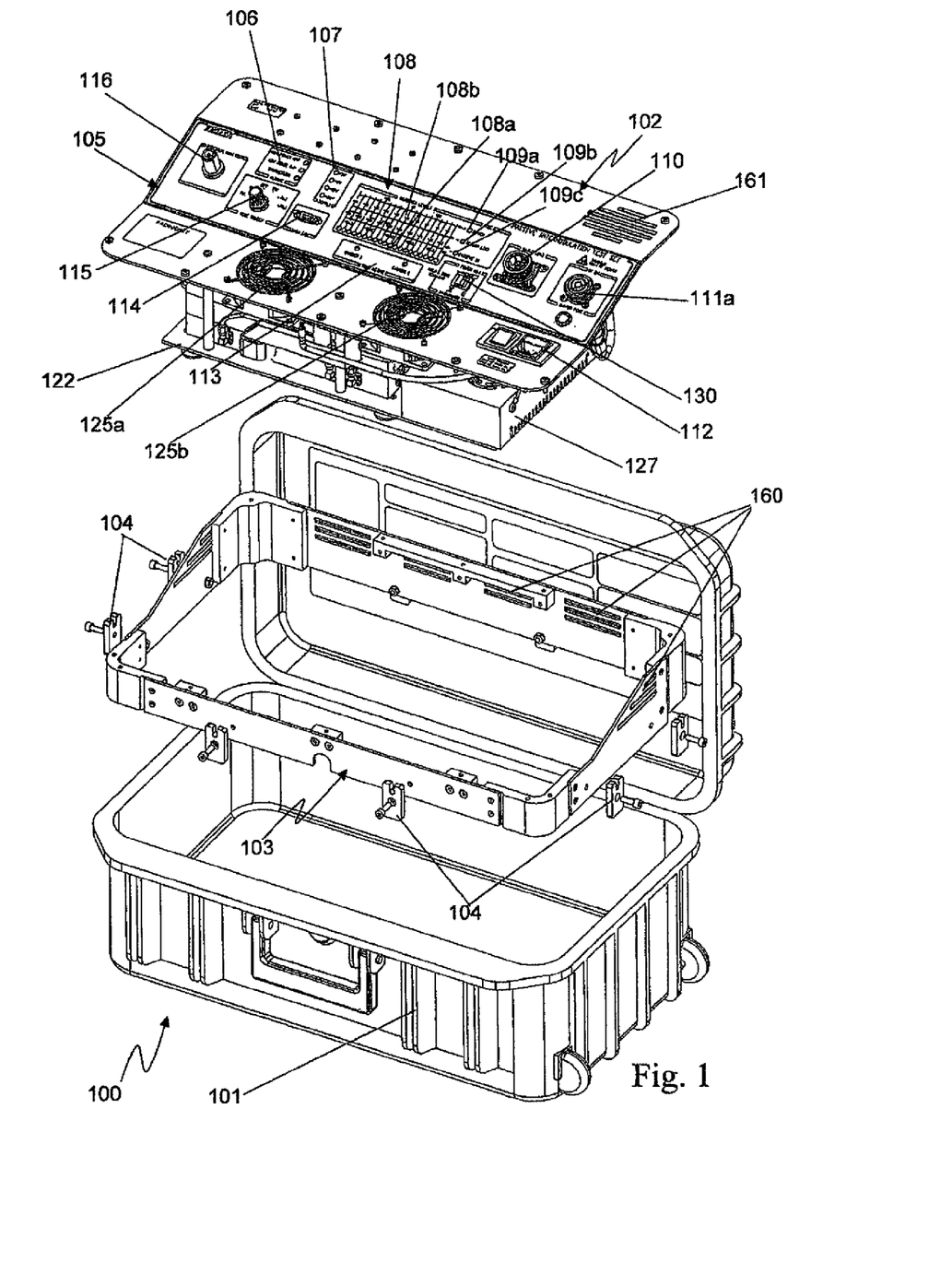
FIG. 1 is an exploded view of the mounting arrangement of the test apparatus according to one embodiment of the present disclosure.

In reference to FIG. 1 there is illustrated one possible arrangement 100 of the portable test unit 102 according to the present disclosure. As shown the unit 102 is mounted a support rack 103 which is in turn mounted within a suitable case 101 via brackets 104 such that the control panel 105 is readily accessible to the user when the case 101 is open.

As shown in FIG. 1 control panel 105 includes an upper and lower portion. The lower portion in this example carries cooling fans 125A and 125B and the mains power socket and switch 112 which is coupled to the unit's main DC power supply 127. The upper portion of the control panel carries the measurement display 108 which includes a LED level display 108a which is associated with a set of calibrated scales 108b.

Each scale is associated with a mode indicator lamp 109a, 109b, 109c which indicates the particular parameter being measured of the device or system coupled to the output port 111a. Thus in order to read off the value of the given test parameter as measured the user simply reads of the value indicated by the LED level display 108a off the appropriate scale 108b as indicated by the currently illuminated mode lamp 109a, 109b 109c. In order to change the current test mode is set the user needs only to rotate the mode selection switch 115 until the desired mode lamp 109a, 109b 109c is illuminated. While the present example provides for the measurement of three system parameters e.g. power, return loss and PIM products, it will be appreciated by those skilled in the art that any number of parameters of interest may be added.

The control panel 105 also includes an alarm indicator panel 106 which in this case provides an indication on the operating status of the various RF units housed below in the present case the alarm panel includes warning lights 106 associated with the units' various electronic modules which in this case include a High Power Amplifier (HPA) module 119, Low Noise Amplifier (LNA) and Frequency Synthesiser both in module 121. A set of warning lamps 107 for the various voltage supply rails within the unit is also provided.

A cable load port 110 is also provided to allow for the testing of the relevant system or device under load conditions. At present the unit is provided with a 50 Ω internal cable load 123 having a return loss rating of 17 dB and PIM of <−120 dBm (for 2×43 dBm carriers). In addition to the measurement display 108 the unit 102 also provides for the use of audible tone within the return loss and PIM test modes. In order to activate the audible tone the user simply toggles switch 130 to the on position as indicated on the control panel. Once the audio tone has been activated the user can then determine changes in the measured level by the repetition rate of the audio tone. Toggle switch 130 also allows the user to adjust the output power by depressing of the switch 130 whilst the unit is in power test mode. The output power rating of the present unit is approximately 43 dBm per carrier and can be varied by ±1 dBm max by depressing switch 130.

While the unit provides the user with reliable measurements of system power, return loss and PIM products, port 116 is provided to allow auxiliary equipment such as a spectrum analyser to be connected to the unit 102 during onsite testing. In addition the user has the option of performing a more detailed analysis of the test results by downloading any test data stored in the unit 102 to a laptop, portable PC or the like via I/O port 114. To enable the download of such data the mode selection switch 115 is set to off (i.e. no test mode set) and the portable PC or laptop is coupled to the I/O port. In order to initiate the download switch 130 is then depressed for a predetermined period e.g. 5 seconds. Such a download may be performed on site or offsite depending on the level of analysis required.

As can be seen from FIG. 1, a number of electronic modules are mounted in a sandwich like configuration, in the space provided between the control panel 105 and base plate 122. It is this sandwich like construction that has allowed the applicant to incorporate an array of RF modules 119, 120, 121, which has not previously been possible, into a single portable unit.

Figure 2:
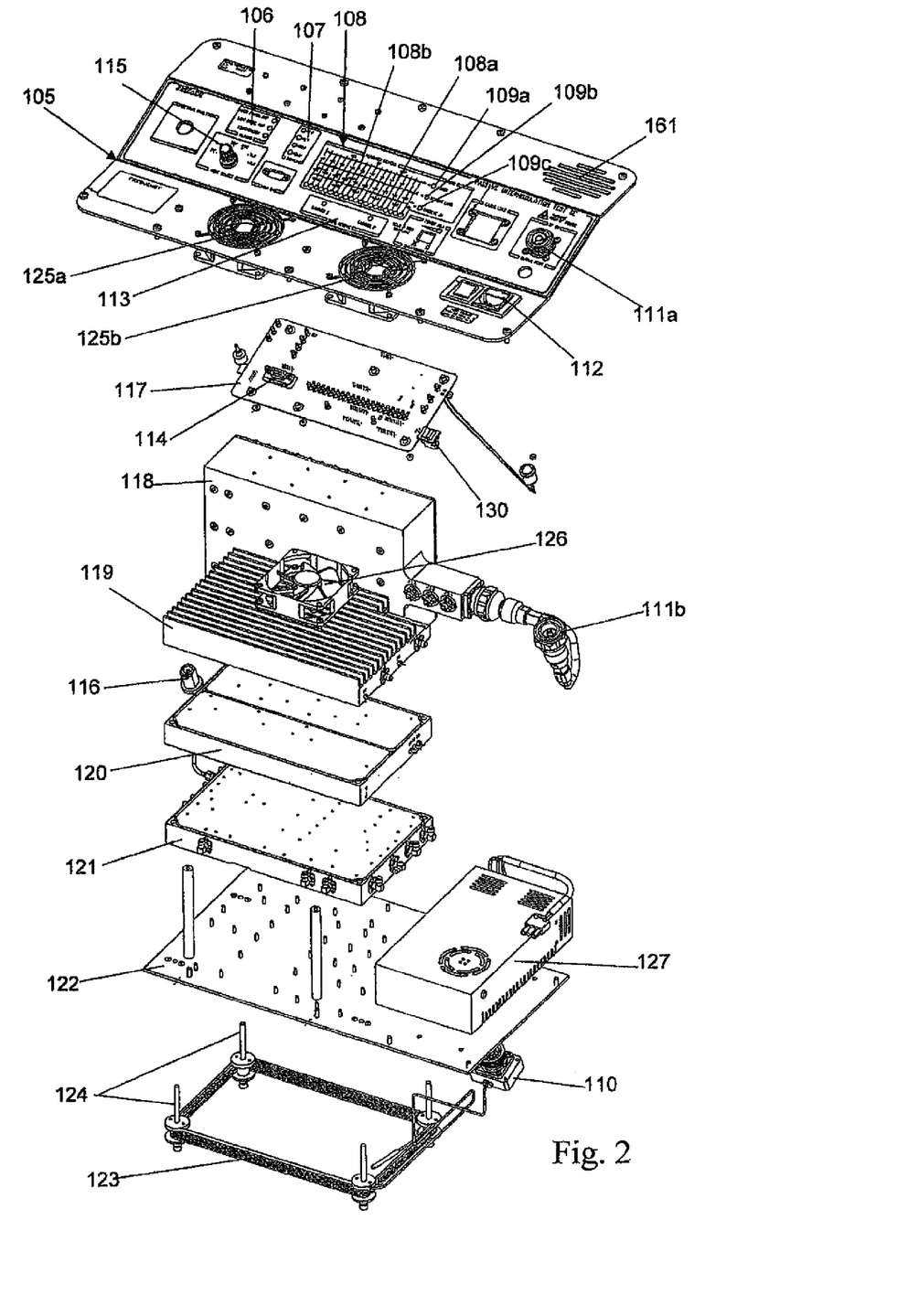
FIG. 2 is an exploded view of the test apparatus according to one embodiment of the present disclosure.

FIG. 2 is an exploded view of the unit 102 of FIG. 1 and provides an illustration of the sandwiching concept of the present disclosure. As can be seen a number of electronic modules are arranged such that they can be stacked in vertical relation. In this example the electronic modules include a High Power Amplifier (HPA) module 119 which is positioned above a DC regulator module 120 which is in turn positioned above a frequency module 121. The three modules are then brought into an interlocking arrangement via the engagement of a lip with a recess or groove in the adjacent module (i.e. similar to tongue and grove joint) to form a vertically stacked array 140. This interlocking arrangement is shown in greater detail in FIGS. 6A and 6B as discussed below. The various circuit boards within the stacked modules are then coupled to the main control board 117 via a series of ribbon cables (not shown). Mounted behind the stacked modules is the filter module 118 which provides the RF signal output to the output port 111a via sub-connector 111b. In the present example the filter module 118 includes a triplexer and at least one forward coupler and at least one reverse coupler.

The applicant has found by arranging the HPA 119, DC regulator 120 and frequency 121 modules in this fashion the effects, on each of the modules, associated with the production of stray RF signals which can occur when high frequency components are brought into close relation are substantially reduced. In addition to this the applicant has also found that the arrangement is substantially easier to cool than most other arrangements and thus the arrangement has a good thermal properties and noise/interference tolerance. A more detailed discussion of one possible cooling arrangement which can be employed in the present disclosure is provided below.

Figure 8:
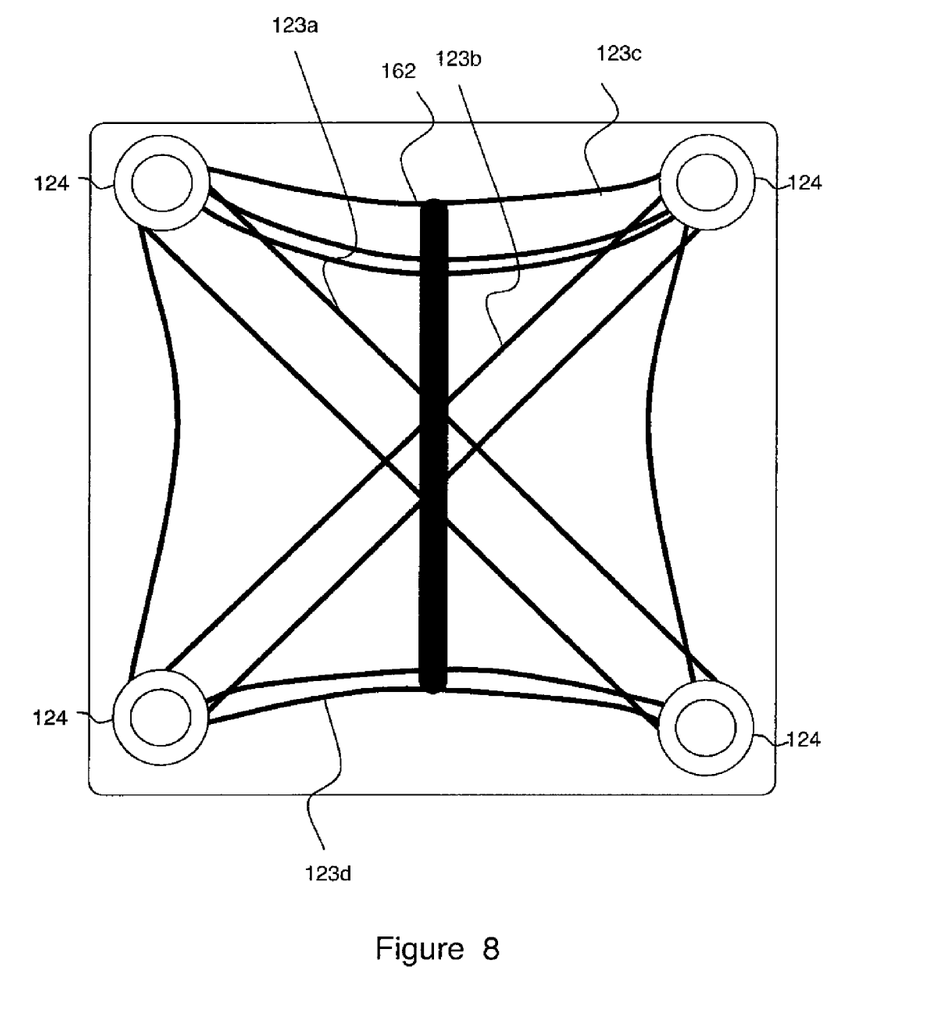
FIG. 8 depicts one arrangement for the winding of a cable load according to one embodiment of the present disclosure.

To complete the construction the vertically stacked array 140 of the HPA 119, DC regulator 120 and Frequency 121 modules is then secured to the base plate 122 adjacent the main DC power supply unit 127. The base plate in this instance serves two purposes not only does it act as a secure mounting platform but it also acts as the cover plate for the frequency module 121. Mounted to the underside of the base plate 122 are a series of supports 124 about which the internal cable load 123 is wound. As shown in FIG. 2 the internal cable load 123 is simply wound around the supports 124 to form a rectangle. However the applicant has found that winding the internal cable load in this fashion can in some instances lead to localised over heating. A more preferred winding arrangement for the internal cable load is shown in FIG. 8 which is discussed in greater detail below.

Figure 3:
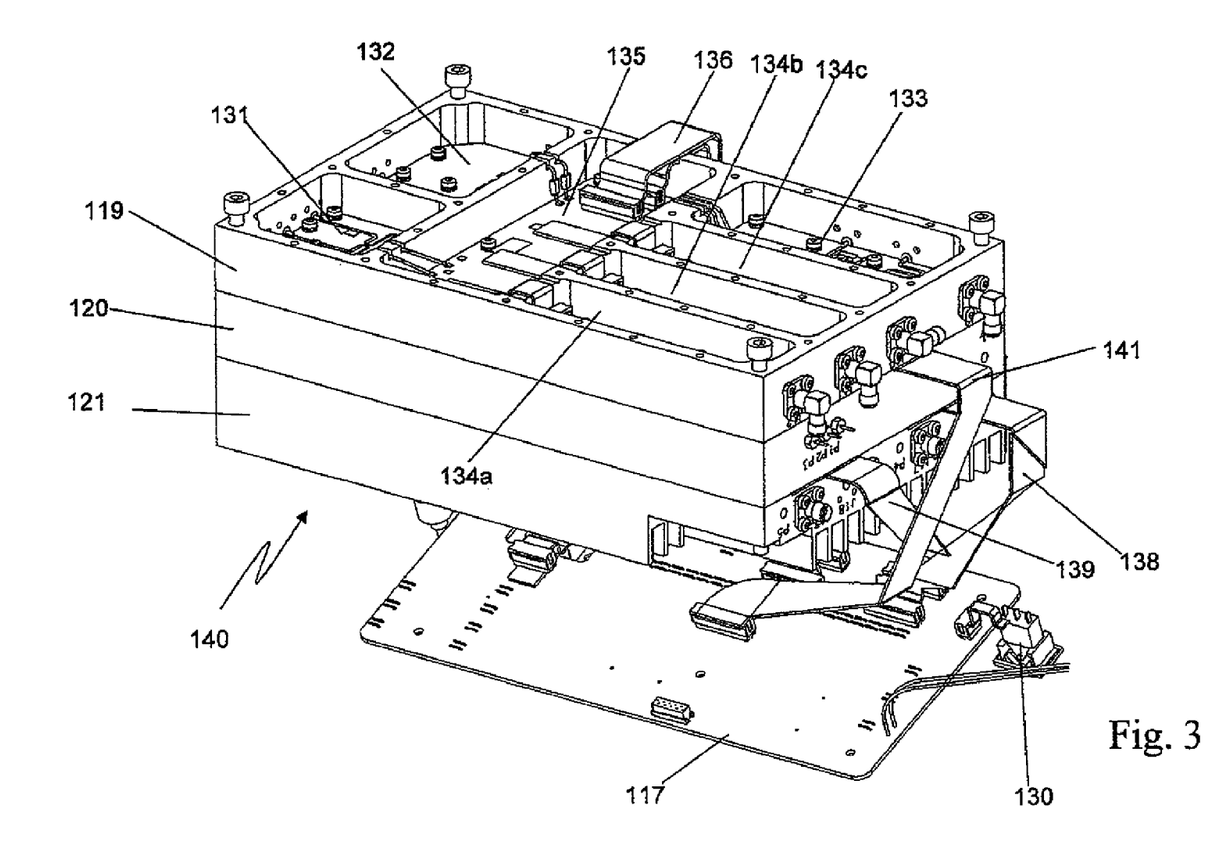
FIG. 3 is a detailed view of the mounting arrangement of the electronic modules according to one embodiment of the present disclosure.

A more detailed view of the vertically stacked array 140 of the HPA 119, DC-DC 120 and frequency 121 modules is shown in FIG. 3. Frequency module 121 in this instance includes a LNA 131, a down converter log detector 132, a Voltage Standing Wave Ratio (VSWR) monitor 133, a plurality of frequency synthesisers 134a, 134b and 134c all of which are interfaced to the underside of the main control board via interface board 135 and cable bundles 136 and 137. In the present example synthesiser 134a is tuned to synthesise a signal at 935.3 MHz, while synthesiser 134b is tuned to synthesise a signal at 884.7 MHz and synthesiser 134c is tuned to synthesise a signal at 50 MHz. Likewise the HPA 119 module is coupled to the underside of the control board 117 via cable bundles 138, 139 and the DC regulator module 120 via cable bundle 141.

Figure 4A:
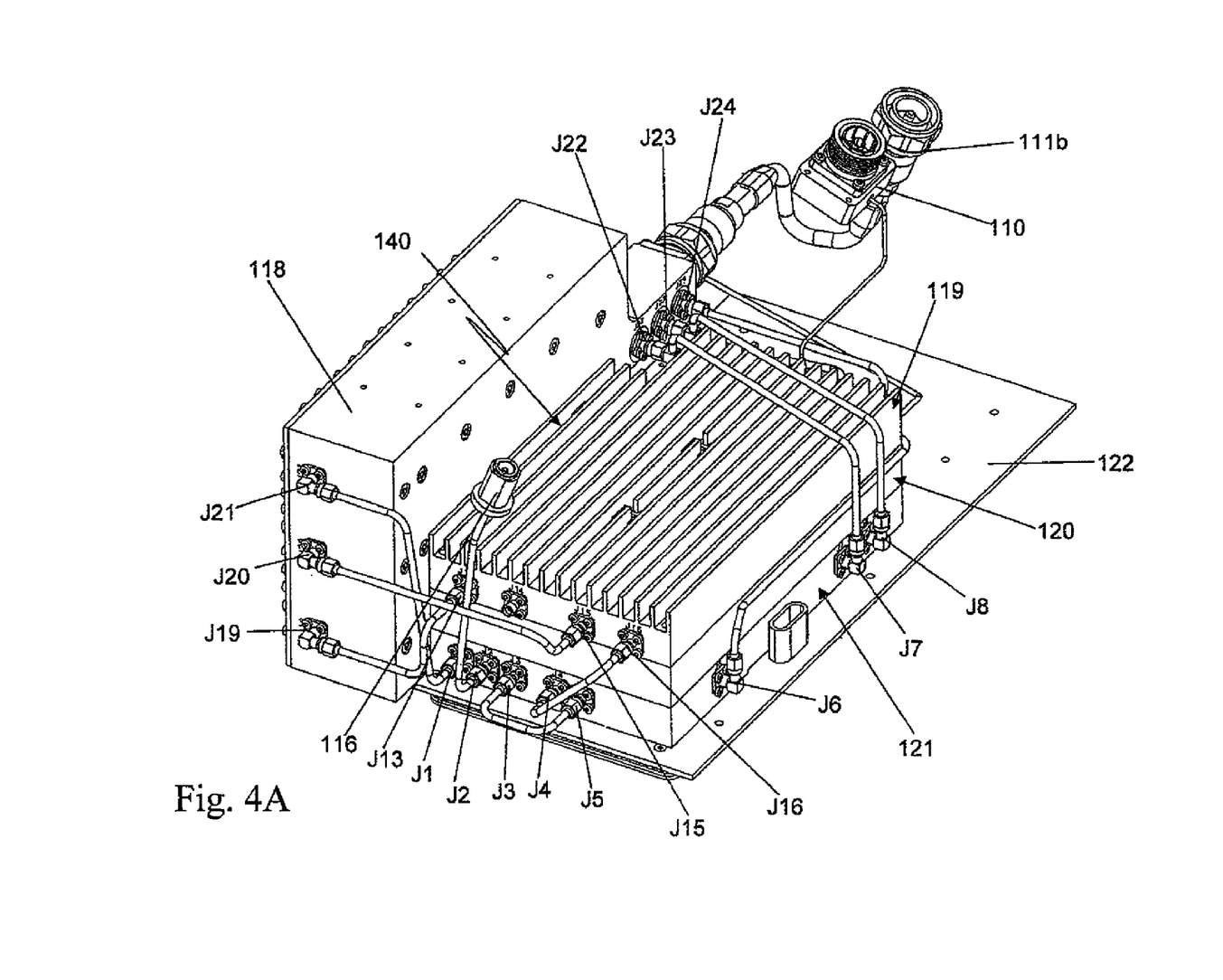
FIG. 4A is a left side perspective view of the mounting arrangement of the electronic modules according to one embodiment of the present disclosure.

FIG. 4A depicts the mounting arrangement between the HPA 119, DC regulator 120, frequency 121 modules and the triplexer and forward/reverse couplers of the filter module 118 in greater detail as viewed from the left. Here the filter module 118 abuts against a longitudinal edge of the vertically stacked array 140, with the input port J19 of the triplexer (the 935.3 MHz input) being coupled to the RF output port J13 of first HPA circuit HPA$_1$ housed within the HPA module 119. Similarly the secondary input port J20 of the triplexer (the 884.7 MHz input) is coupled to the RF output port J15 of second HPA circuit HPA$_2$ housed within the HPA module 119. The output port J21 (the 884.7 MHz output) of the triplexer is then coupled to the RF input of the Low Noise Amplifier (LNA) 131 of the frequency module 121. Also shown is the secondary RF output J2 of the LNA 131, J2 being directly coupled to the auxiliary port 116 on control panel 105. Finally the main RF output J3 of the LNA 132 is coupled to the 884.7 MHZ input J5 of the down converter 133.

Figure 4B:
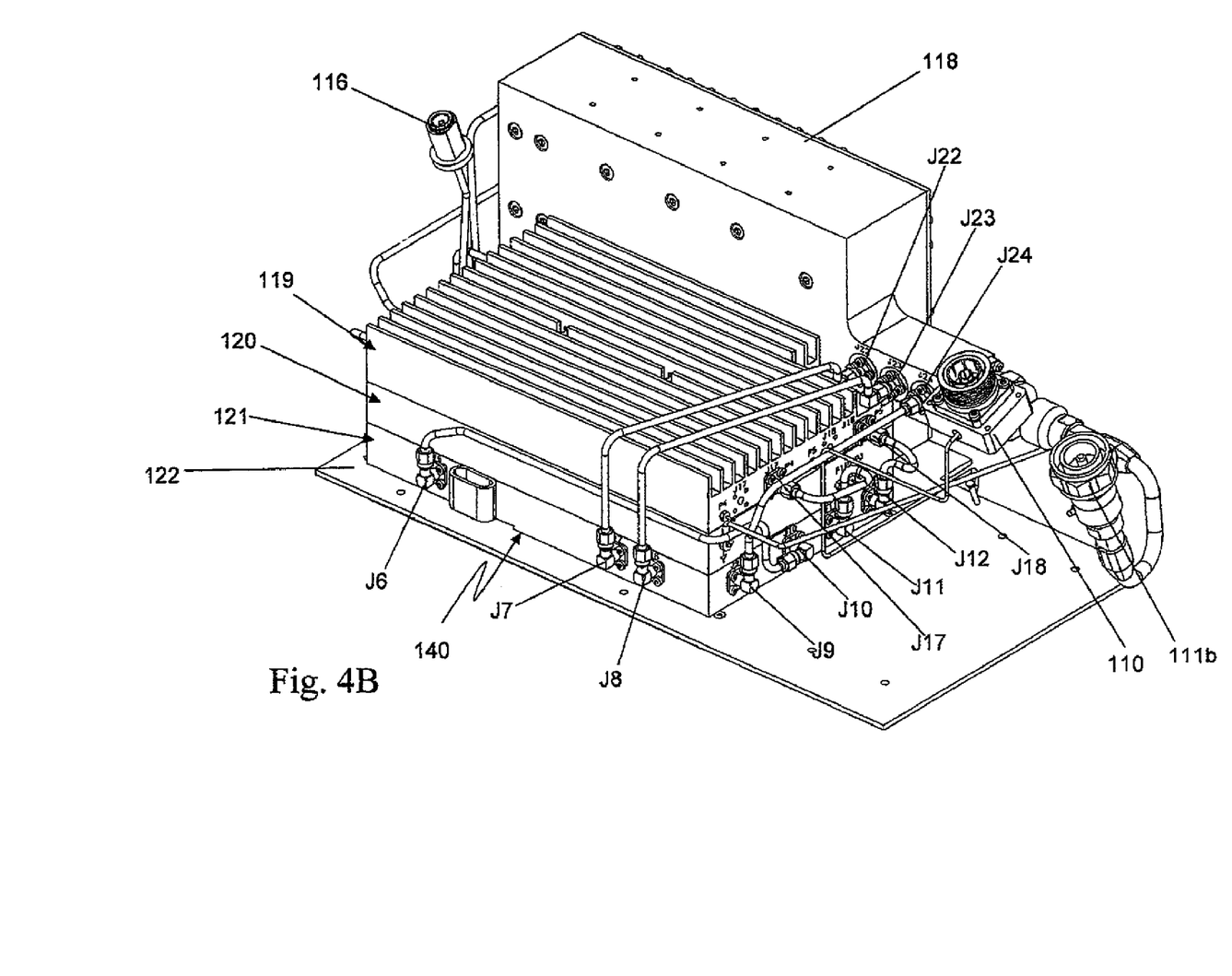
FIG. 4B is a right side perspective view of the mounting arrangement of FIG. 4A.

FIG. 4B shows the mounting arrangement of FIG. 4A from the right hand end, as shown the 50 MHz input J6 of the down converter 132 housed within the frequency module 121 which is coupled to the 50 MHz synthesiser 134c via connector J10. The forward input J7 of the VSWR monitor 133 is connected to the forward coupler of the triplexer and forward/reverse coupler assembly 118 via connector J22, while the first and second reverse inputs J8 and J9 respectively are connected to the first and second reverse couplers J23 and J24 respectively. The 935.3 MHz synthesiser 134a in this instance is coupled via connector J12 to the input of the first HPA circuit HPA$_1$ via connector J18, likewise the 884.7 MHz synthesiser 134b is coupled via connector J11 to the input of the second HPA circuit HPA$_2$ via connector J17.

As can be seen from both FIGS. 4A and 4B the HPA module 119 in this instance has an integrally formed heat-sink to which a fan 126 can be attached. The provision of the integral heat-sink further assists the cooling of the vertically stacked array 140.

Figure 5:
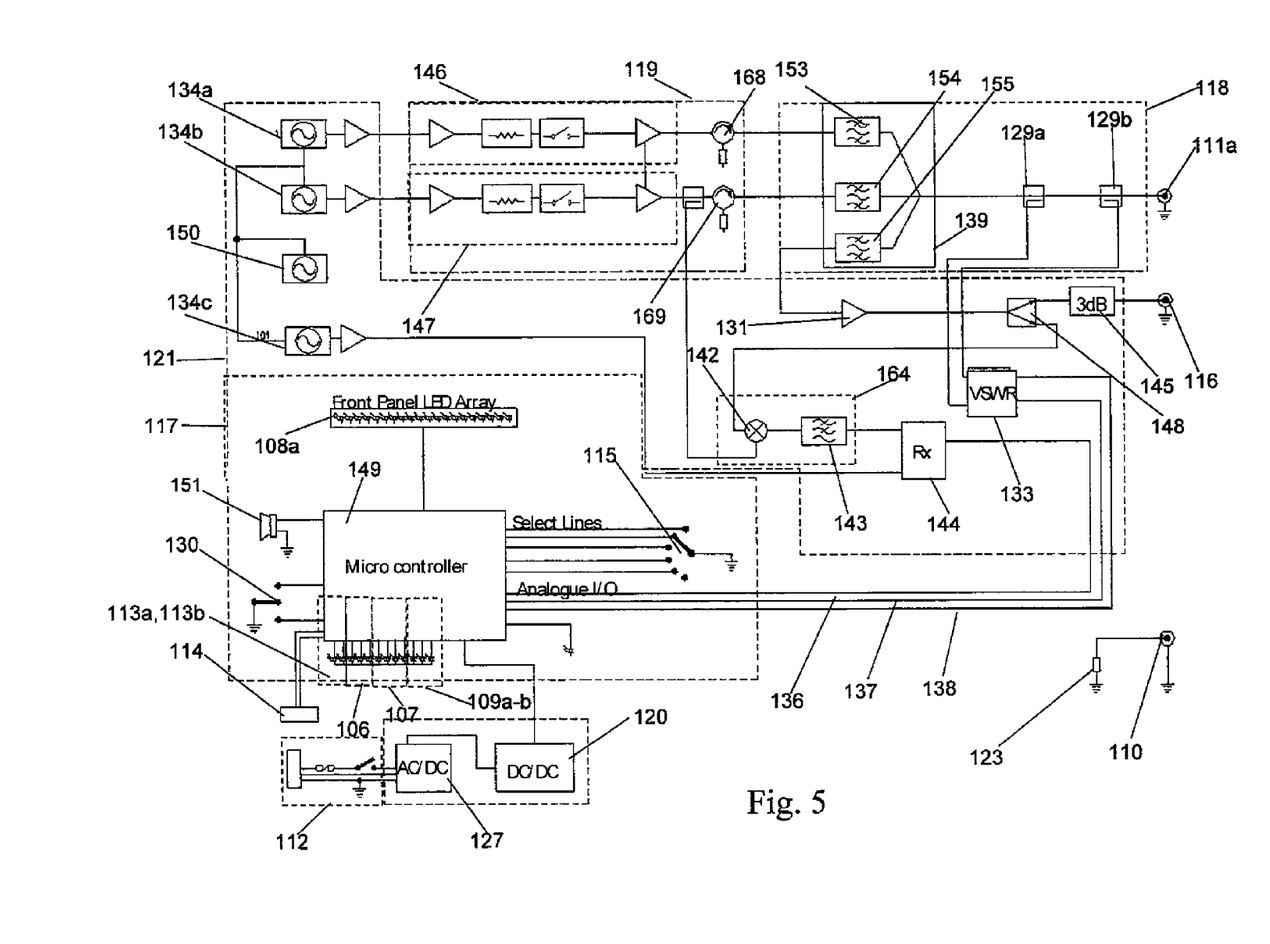
FIG. 5 is a system schematic for the test apparatus of FIGS. 1 to 4B above.

FIG. 5 is system schematic of the test apparatus of FIGS. 1 through to 4B further detailing the interconnection between the test unit's various electronic modules. As discussed in relation to FIG. 4A above the HPA module 119 is coupled to the filter module 118. More specifically the output of the first HPA circuit HPA$_1$ 146 is coupled to the first bandpass filter 153 of the triplexer 139 through isolator 168, while the output of the second HPA circuit HPA$_2$ 147 is coupled to the second bandpass filter 148 of the triplexer 139 through isolator 169. The triplexer is then coupled to the unit's output port 111a through forward 129a and reverse 129b couplers and via sub-connector 111b (not shown). The couplers 129a and 129b are in turn connected to the VSWR monitor 133 of the frequency module 121.

The output of the triplexer 139, which in this case is taken from bandpass filter 155, is coupled to the LNA 131 of the frequency module 121. The output of the LNA is then coupled to a splitter 148. One arm of the splitter 168 is connected to the auxiliary output port 116 via a 3 dB attenuator 145. The remaining arm of the splitter is passed to the down converter 164, which in this case comprises mixer 142 coupled to a lowpass filter 143. The output from HPA$_2$ is also connected to the down converter 164 through coupler 167 via mixer 142. The output of the down converter 164, from lowpass filter 143 is then fed to receiver 144.

As discussed above the frequency module 121 in this particular example includes three frequency synthesisers 134a, 134b and 134c. Here the synthesisers are coupled to a temperature controlled crystal oscillator which provides a reference of MHZ. As previously mentioned the frequency module 121 is interfaced to the HPA module 119. More specifically the output of the first frequency synthesiser 134a which in this case is tuned to a frequency of 935.3 MHz is coupled to the input of the first HPA circuit HPA$_1$ 146, while the frequency synthesiser 134b which in this case is tuned to a frequency of 884.7 MHz is coupled to the input of the second HPA circuit HPA$_2$ 147. The output of the third frequency synthesiser 134c which in the present case is tuned to 50 MHz is coupled to receiver 144.

As shown the analogue output 136 carrying the PIM test data from receiver 144 and the analogue outputs 137 and 138 which carry the power and return loss test data respectively from the VSWR monitor 133 are coupled to the analogue inputs of the local processor 149 housed on control board 117. The local process then proceeds to display the value of the measured parameter on LED display 108a or through audio speaker 151 depending on the test mode selected via mode switch 115 as indicated via lamps 109a to 109c, 113a and 113b. The local processor 149 may also keep a log of the tests data collected, which may then be downloaded for later analysis via 110 port 114 on depression of switch 130 in the manner discussed above.

The local processor 149 is also responsible for the adjustment of the output power level on depression of switch 130 for a selected period of time, for example 3 to 5 seconds. In addition to this the local processor is also responsible for monitoring of the operating status of each of the systems modules and the various voltage supply rails provided by the unit's DC module 119. The DC module 119 is coupled to the mains 112 via main power supply 127. Any failures detected by the local processor in a given module are indicated to the operator via warning lamps 106 and 107 discussed above.

Before the test unit 102 is deployed a number of the internal units must be firstly calibrated. In order to calibrate the unit's output power the unit is connected to a main PC via the I/O port 114 and a power meter under GPIB control is connected to the output port 111a. The main computer then adjusts the output power and reads the resultant measurement off the power meter via GPIB. Closed loop control then calibrates the power out and stores the calibration data in the unit's local processor 149. Once calibrated the output power can be adjusted via switch 130 over a range of 42-43.9 dBm.

The calibration of the receiver requires the internal cable load 123 to be disconnected. A known signal level is then injected into the test port 111a via a signal generator. Control of the signal generator is again managed via GPIB, while the main computer monitors the Received Signal Strength Intensity (RSSI) via the I/O port 114. The RSSI is calibrated in 1 dB steps over the range −105 to −60 dBm with the calibration data being store to the unit's local processor.

The VSWR unit 133 is calibrated by applying known return loss elements (5 in all) to the units test port 111a in the following steps 3 dB, 5 dB, 10 dB, 15 dB, 20 dB. Whilst under control of the main computer each calibrated load is applied and the return loss data stored in the unit's local processor 149.

Figure 6A:
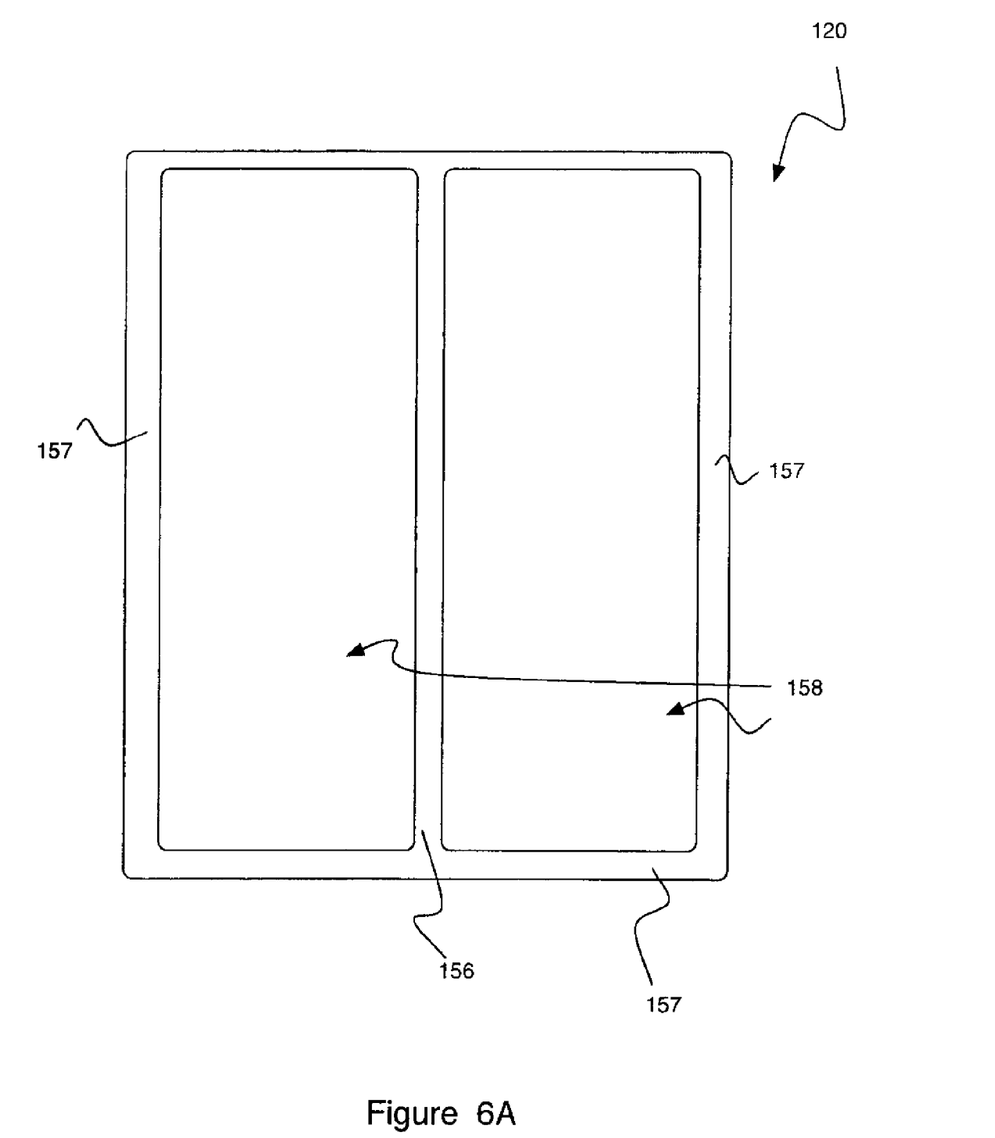
FIG. 6A is a detailed view of one half of the interlocking arrangement for adjacent electronic modules according to one embodiment of the present disclosure.
Figure 6B:
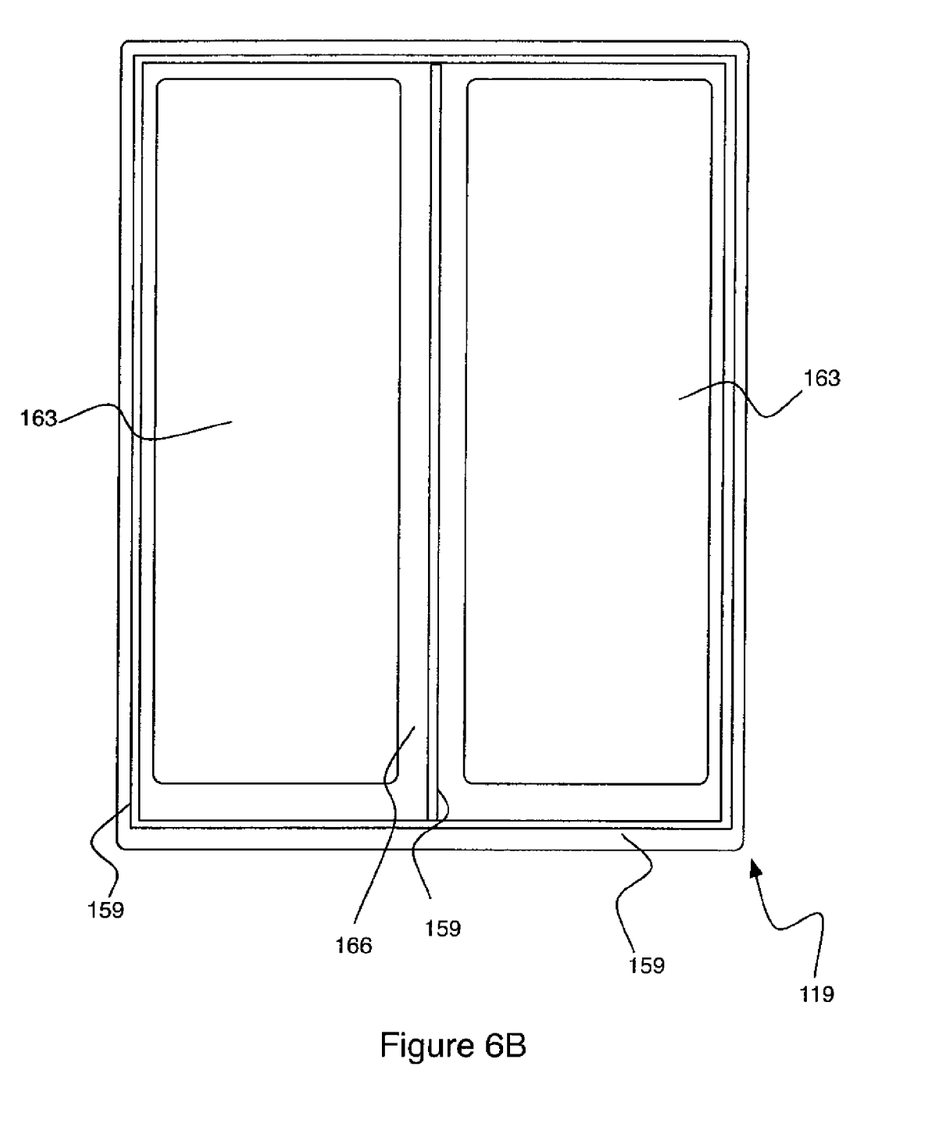
FIG. 6B is a detailed view of the second half of the interlocking arrangement of FIG. 6A.

With reference to FIGS. 6A and 6B there is illustrated the interlocking arrangement for adjacent electronic modules according to one embodiment of the present disclosure. In 6A the upper surface of a DC regulator module 120 is shown. The upper surface of the module 120 is provided with a central groove 156 which spans the length of the module 120, while a recessed portion 157 extends around the outer periphery of the module 120. The combination of the groove 156 and recessed portion 157 forms two rectangular portions 158, the rectangular portions being shaped to fit the exposed sections 163 of the HPA circuits of the HPA module 119 as shown in FIG. 6B. As shown in FIG. 6B the HPA module 119 includes a plurality of lip portions 159 which are disposed around the outer periphery and the exposed edge of internal wall 166 of the module 119. When the HPA module 119 stacked on top of the DC regulator module 120 the lip portions 159 mate with the groove 156 and recessed portion 157 of the DC regulator module 120, such that the rectangular portions 158 seal the exposed sections 163 of the HPA module 119.

A similar type of interlocking arrangement is provided between the upper surface of the frequency module 121 and the exposed base of DC regulator module 120. The frequency module 121 in this case is provided with a recessed portion extending about the outer periphery of the module 121, so as to form a rectangular portion. The rectangular portion acts to seal the exposed base of the DC module 120 upon engagement of the lip portion provided on the outer periphery of the base of the DC module 120 with the recess of the frequency module 121. The base of the frequency module is then sealed by securing the stacked HPA 119, DC regulator module 120 and frequency module 121 to the base plate 122.

Figure 7:
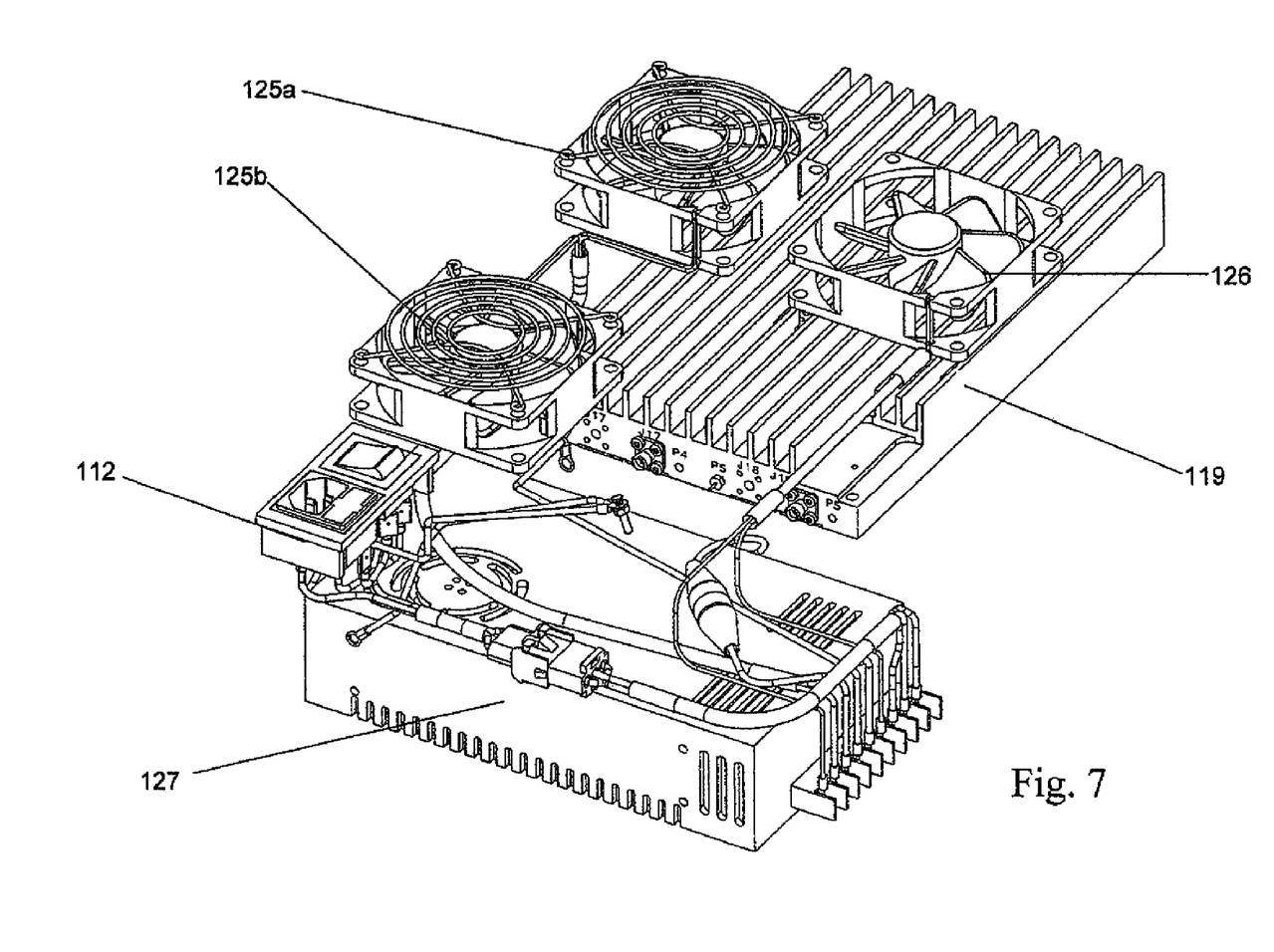
FIG. 7 is a perspective view of one possible arrangement of a cooling system according to one embodiment of the present disclosure.

One possible configuration of the cooling system of the present disclosure is illustrated in FIG. 7. As shown case fans 125a and 125b and HPA fan 126 are wired directly to the main DC power supply 127. The fans in this instance are wired in a push configuration, i.e. the fans act to draw cool air in from outside the casing into the apparatus the HPA fan then forces this cooler air onto the heat-sink of the HPA 119. Hot air is then vented through ventilation slots 160 in the rear and sides of the mounting rack 103, and from the ventilation slots 161, that may be provided in the upper most portion of the control panel 105. It will be appreciated by those of ordinary skill in the art that the fans could be wired in a pull configuration wherein they pull hot air away from the unit the cool air then being drawn in through the ventilation slots 160 and 161, or any combination of push/pull configurations.

FIG. 8 shows an alternate winding configuration for the internal cable load 123 which has been found to substantially reduce the occurrence of hot spotting. The cable is wound such that a number of cable loops 123a, 123b are crisscrossed from the opposing diagonal supports 124 with the remaining portion of the cable load 123 being wound around the parameter of the rectangle formed by the four supports. The opposing longitudinal side of the cable load 123c and 123d are then drawn toward each other by means of a cable tie 162.

Figure 9:
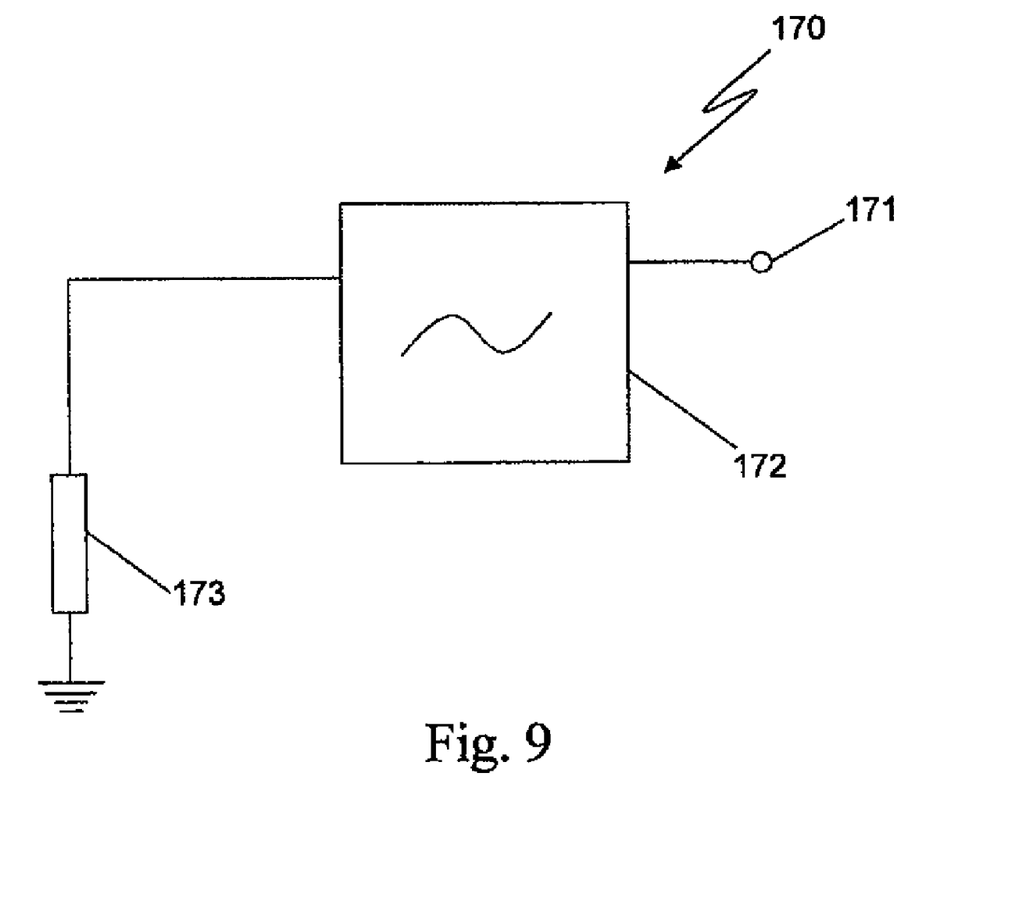
FIG. 9 is a schematic block diagram of one possible arrangement of a cable load according to one embodiment of the present disclosure.

With reference to FIG. 9 there is illustrated a one possible arrangement for the internal load 170 according to one embodiment of the present disclosure. In this particular instance the load 170 is a filtered load, which includes at least one filter 172 and a resistor 173. The filter 172 may be a bandstop, a bandpass or a suitable filter network, the resistor is preferable a 50∧50 watt resistor. The filtered load is coupled via output connector 171 to the output port 111a via sub-connector 111b (not shown). Preferably the filtered load is contained within an aluminum housing. Mounting the filtered load inside such a housing offers a number of advantages, it allows the load to be easily positioned and secured during assembly of test apparatus, it also offers better isolation and better cooling (i.e. the likelihood of localised over heating is further reduced).

It is to be understood that the above embodiments have been provided only by way of exemplification of this disclosure, and that further modifications and improvements thereto, as would be apparent to persons skilled in the relevant art, are deemed to fall within the broad scope and ambit of the present disclosure described herein.

The invention claimed is:

1. A portable test apparatus for a communications device, said apparatus comprising:
   a control panel comprising at least one display for displaying test information from the communications device;
   a filter module assembly;
   at least one amplifier module;
   at least one voltage regulator module; and
   at least one frequency module;
   wherein said at least one amplifier, voltage regulator and frequency module are stacked in a substantially vertical relation.

2. The apparatus of claim 1 wherein said apparatus further comprises at least one port for the attachment of a load.

3. The apparatus claim 2 wherein the load is a cable load housed within the test apparatus.

4. The apparatus of claim 1 wherein said apparatus further comprises a cable load housed within the test apparatus and at least one port for the measurement of an external device.

5. The apparatus of claim 1 wherein the apparatus provides a plurality of selectable test modes.

6. The apparatus of claim 5 wherein the selectable test modes comprise a power test mode, a return loss test mode and a passive intermodulation test mode.

7. The apparatus of claim 6 wherein the display comprises a LED level display associated with a plurality of calibrated scales wherein each of the plurality of scales is associated with a test mode.

8. The apparatus of claim 6 wherein at least one audible tone is provided in the return loss or the passive intermodulation test modes.

9. The apparatus of claim 1 wherein the apparatus further comprises at least one port for the attachment of an auxiliary device.

10. The apparatus of claim 9 wherein the auxiliary device is a spectrum analyser.

11. The apparatus of claim 9 wherein the auxiliary device is a portable computer.

12. The apparatus of claim 1 wherein the apparatus further comprises at least one port for the attachment of an auxiliary device and an I/O port for the attachment of a portable computer.

13. The apparatus of claim 1 wherein the filter module further comprises a triplexer and a forward and reverse coupler.

14. The apparatus of claim 13 wherein the filter module further comprises a second reverse coupler.

15. The apparatus of claim 1 wherein the amplifier module further comprises at least one high power amplifier circuit.

16. The apparatus of claim 1 wherein the amplifier module further comprises first high power amplifier circuit and second high power amplifier circuit wherein said first high power amplifier circuit is parallel to the second amplifier circuit.

17. The apparatus of claim 1 wherein the voltage regulator provides a plurality of DC voltage rails.

18. The apparatus of claim 17 wherein the plurality of DC voltage rails includes at least one +5V rail, at least one +12V rail and at least one +26V rail.

19. The apparatus of claim 1 wherein the frequency module comprises at least one frequency synthesiser, a log detector and down converter circuit, a low noise amplifier and a voltage Standing Wave ratio (VSWR) monitor.

20. The apparatus of claim 1 wherein the frequency module comprises a first frequency synthesiser, a second frequency synthesiser, a third frequency synthesiser, a log detector and down converter circuit, a low noise amplifier and a Voltage Standing Wave Ratio (VSWR) monitor.

21. The apparatus of claim 20 wherein the first and second frequency synthesisers are adapted to produce a frequency between 800 and 1000 MHz and the third frequency synthesiser is adapted to produce a frequency of approximately 50 MHz.

* * * * *